United States Patent
Abert

(10) Patent No.: US 8,081,471 B2
(45) Date of Patent: Dec. 20, 2011

(54) MODULE FOR AN AUTOMATION DEVICE

(75) Inventor: Michael Abert, Au (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 12/579,677

(22) Filed: Oct. 15, 2009

(65) Prior Publication Data

US 2010/0027222 A1 Feb. 4, 2010

Related U.S. Application Data

(63) Continuation of application No. 11/897,375, filed on Aug. 30, 2007, now abandoned.

(30) Foreign Application Priority Data

Aug. 30, 2006 (EP) .................................... 06018133

(51) Int. Cl.
 *H05K 7/20* (2006.01)
(52) U.S. Cl. ........ 361/715; 361/690; 361/695; 361/707; 312/223.2; 174/547; 257/721
(58) Field of Classification Search .................. 361/690, 361/692, 695, 697, 699, 700, 703, 707, 715, 361/721, 688, 698, 717–720, 729, 735
 See application file for complete search history.

(56) References Cited

U.S. PATENT DOCUMENTS

| | | | |
|---|---|---|---|
| 4,401,351 A | 8/1983 | Record | |
| 4,656,559 A * | 4/1987 | Fathi | ............ 361/721 |
| 5,112,119 A | 5/1992 | Cooke et al. | |
| 5,595,240 A | 1/1997 | Daikoku et al. | |
| RE35,721 E | 2/1998 | Daikoku et al. | |
| 6,084,771 A * | 7/2000 | Ranchy et al. | ............... 361/699 |
| 6,104,611 A * | 8/2000 | Glover et al. | ............... 361/700 |
| 6,116,916 A * | 9/2000 | Kasai | ........................ 439/76.2 |
| 6,144,556 A | 11/2000 | Lancios | |
| 6,201,700 B1 * | 3/2001 | Tzinares et al. | ............ 361/719 |
| 6,393,775 B1 | 5/2002 | Staschik | |
| 6,411,514 B1 | 6/2002 | Hussaini | |
| 6,504,719 B2 | 1/2003 | Konstad et al. | |
| 6,754,073 B2 | 6/2004 | Gundlach et al. | |
| 6,765,793 B2 * | 7/2004 | Kehret et al. | ............... 361/690 |
| 6,796,808 B2 * | 9/2004 | Hosoe et al. | ................ 439/76.2 |
| 6,979,772 B2 | 12/2005 | Meng-Cheng et al. | |
| 7,031,156 B2 | 4/2006 | Naiva et al. | |
| 7,095,611 B2 * | 8/2006 | Kunz | ...................... 361/679.33 |

(Continued)

FOREIGN PATENT DOCUMENTS

CN 1051261 A 5/1991

(Continued)

OTHER PUBLICATIONS

Siemens AG, "Simatic S7-200", Siemens ST 70 News, 2006, pp. 3/1-3/6.

*Primary Examiner* — Courtney Smith

(57) ABSTRACT

A module for an automation device with a plurality of adjacent modules is provided. The module includes a housing capsule that has at least one rear wall and two side walls and which is provided for housing electric components. Further, an automation device including the module is provided. One of the side walls of the modules is embodied as being thermally conductive and that the other side wall is embodied as being thermally insulated.

5 Claims, 2 Drawing Sheets

U.S. PATENT DOCUMENTS

| | | |
|---|---|---|
| 7,136,286 B2 | 11/2006 | Chuang |
| 7,180,747 B2 | 2/2007 | Lee |
| 7,272,945 B2 * | 9/2007 | Bash et al. ............... 62/180 |
| 7,283,363 B2 | 10/2007 | Lee |
| 2004/0105036 A1 | 6/2004 | Danner et al. |
| 2005/0012206 A1 * | 1/2005 | Nakamura et al. ............ 257/717 |
| 2005/0078448 A1 * | 4/2005 | Kunz ..................... 361/690 |
| 2005/0099771 A1 | 5/2005 | Wei |
| 2007/0076355 A1 * | 4/2007 | Oohama ..................... 361/676 |
| 2007/0297138 A1 | 12/2007 | Huang et al. |
| 2008/0043425 A1 | 2/2008 | Hebert et al. |

FOREIGN PATENT DOCUMENTS

| | | |
|---|---|---|
| CN | 24769 Y | 2/2002 |
| DE | 2015361 A1 | 10/1971 |
| EP | 0681421 A2 | 11/1995 |

\* cited by examiner

MODULE FOR AN AUTOMATION DEVICE

CROSS REFERENCE TO RELATED APPLICATIONS

This application is a continuing application of U.S. application Ser. No. 11/897,375 filed Aug. 30, 2007 now abandoned. This application claims priority of European Application No. 06018133.6 EP filed Aug. 30, 2006; both applications are incorporated by reference herein in their entirety.

FIELD OF INVENTION

The invention relates to a module for an automation device that consists of a plurality of adjacent modules, having a housing capsule that has at least one rear wall and two side walls and which is provided for housing electric components. The invention relates further to an automation device having modules of said type.

BACKGROUND OF INVENTION

An example of a module is known from Siemens' Catalog "ST 70 News 2006", Section 3: "SIMATIC S7". Located inside a housing capsule of the module is a printed circuit board fitted with electric and electronic components. Said components are cooled mainly through convection in a manner such that air flows through an opening on the underside of the housing capsule and across the components, then finally through an opening on the top side of the housing capsule, with the air that flows through the housing removing heat from the components. Said openings in the housing capsule below and above the components are problematic especially if the modules or automation device are/is employed in areas exposed to explosion hazards or in applications requiring a tight seal. Moreover, adjacent modules in the automation device heat each other, a factor that has to be considered during project work on the automation device and which, owing to the modular automation device's wide-ranging combination potential, makes such work difficult.

SUMMARY OF INVENTION

An object of the present invention is to provide a module of the type cited in the introduction having improved heat dissipation. Further to be disclosed is an automation device having improved heat dissipation.

Said object is achieved in terms of the module by embodying one of the side walls as being thermally conductive and the other as being thermally insulated. Said object is achieved in terms of the automation device by means of the measures disclosed in the claims.

It is advantageous that the openings in the housing capsule below the electric and electronic components can be dispensed with and a closed structural form facilitated thereby. The side wall embodied as being thermally conductive is provided for dissipating heat from the module; the side wall embodied as being thermally insulated will prevent thermal coupling to an adjacent module of an assembled automation device. As thermal coupling of the modules is prevented, adjacent modules will not heat each other.

In an embodiment of the invention the thermally conductive side wall is embodied substantially as being unshaped and/or as having the form of ribs, the effect of which is to enlarge the heat-releasing side-wall area.

In a further embodiment of the invention it is provided for the electric components of the module, for example a printed circuit board fitted with electronic components, to be thermally coupled to the thermally conductive side wall. The removal of heat from the module will be further improved thereby.

In an automation device having modules of said type wherein one module's thermally conductive side wall is in each case adjacent to another module's thermally insulated side wall, the respective thermally conductive side wall's rib height or, as the case may be, its width (chimney width) is matched to the respective module's heat loss. The rib height or, as the case may be, chimney width of modules losing less heat is embodied as being smaller than that of modules losing more heat, as a result of which modules with a low heat loss will, when modules are of equal width, have more space for functional elements.

BRIEF DESCRIPTION OF THE DRAWINGS

The invention and its embodiments and advantages are explained in more detail below with the aid of the drawing in which an exemplary embodiment of the invention is illustrated.

DETAILED DESCRIPTION OF INVENTION

Figure 1:
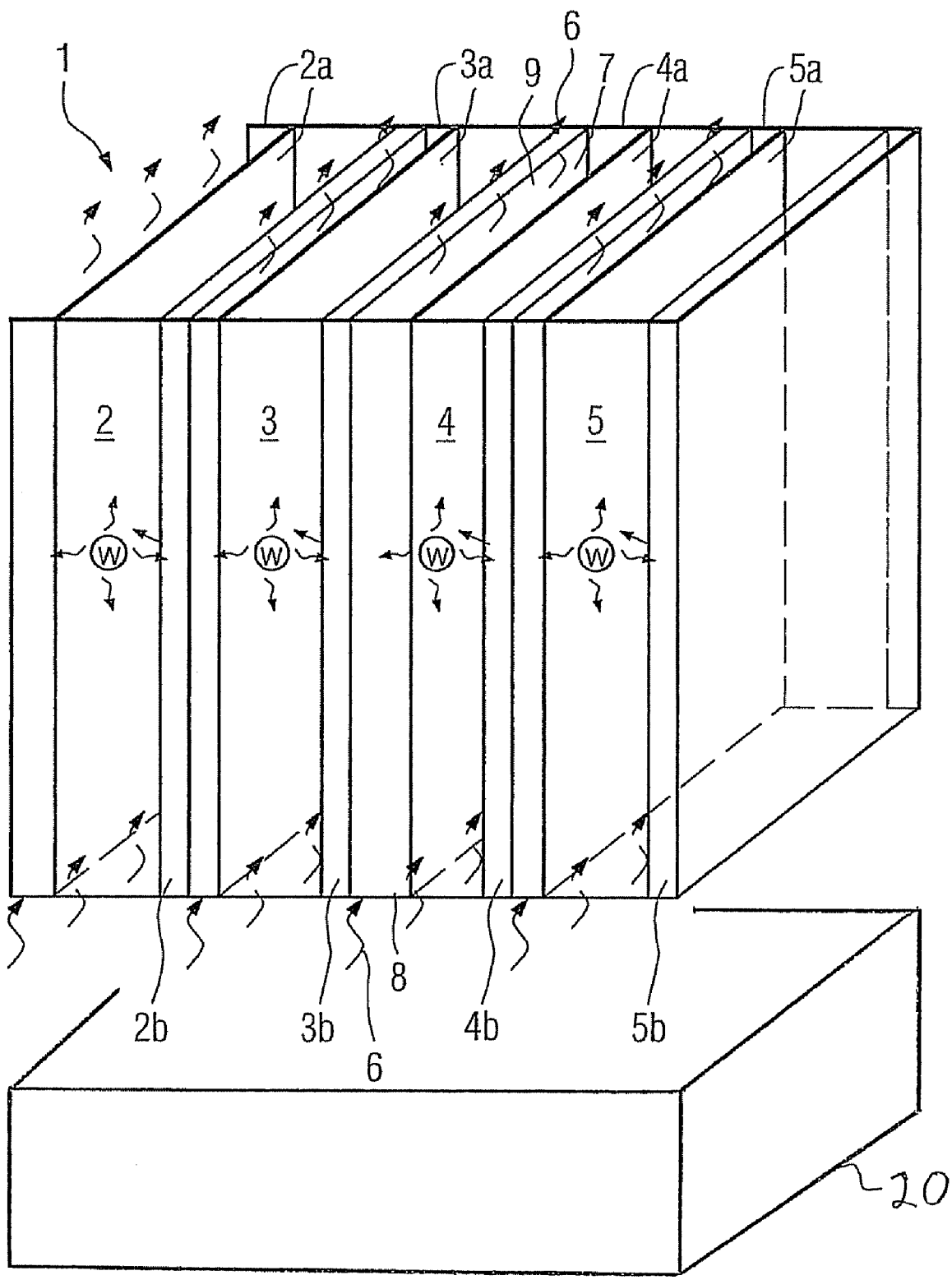
FIG. 1 shows a modular automation device.

Identified by the numeral 1 in FIG. 1 is a modular automation device that includes four modules 2, 3, 4, 5 of equal width. Further constituents of the automation device 1, for example communication means via which the modules are interconnected or suitable hooking devices for attaching the modules to a support rail (not shown here), are of no significance to the invention and will not be elucidated in the following. The modules can of course be embodied as being of different width. It is, though, advantageous for visual or design reasons for the width of the modules to be made the same or having the same modularity (2×, 3× etc. width). The modules 2, 3, 4, 5 each have a thermally conductive u-shaped side wall 2a, 3a, 4a, 5a and each a thermally insulated side wall 2b, 3b, 4b, 5b, with in each case a thermally insulated side wall 2b, 3b, 4b, 5b of one module 2, 3, 4, 5 being adjacent to in each case a thermally conductive side wall 2a, 3a, 4a, 5a of a further module 2, 3, 4, 5.

It is assumed in the present example that the module 4 has a greater heat loss during control operations than the modules 2, 3, 5, meaning that more heat has to be removed from the module 4 than from the modules 2, 3, 5. The thermally conductive side wall 4a of the module 4 is for that purpose embodied as being wider than the thermally conductive side walls 2a, 3a, 5a of the modules 2, 3, 5. The width of the thermally insulated side walls 2b, 3b, 4b, 5b is the same for all the modules 2, 3, 4, 5, as a result of which the heat conditions on said walls are substantially identical. Heat is removed from the modules 2, 3, 4, 5 substantially through thermal convection. For that purpose air 6 flows through, for example, a "chimney" 7 formed by the thermally insulated side wall 3b of the module 3 and by the thermally conductive side wall 4a of the module 4 from a chimney inlet 8 to a chimney outlet 9, with the air 6 removing heat from the thermally conductive side wall 4a of the module 4.

Figure 2:
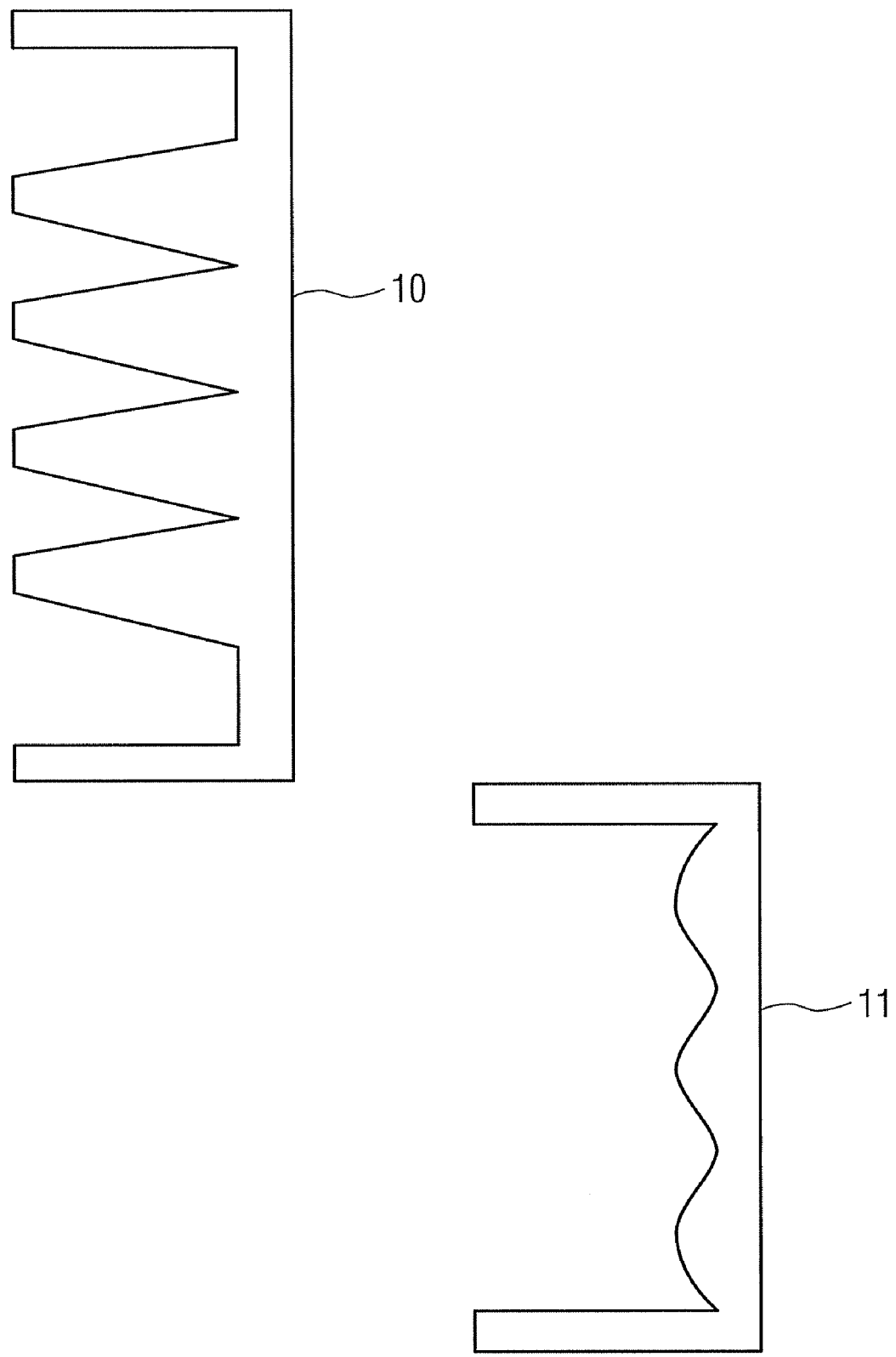
FIG. 2 shows cross-sections of thermally conductive side walls.

In order to enlarge the surface of a thermally conductive side wall, one side wall 10 (FIG. 2) is embodied at least partially as being rib-shaped and a further side wall 11 as wave-shaped. Measures of such type will enlarge the heat-releasing side-wall area, as a result of which the removal of heat from a module will be improved.

The described arrangements and embodiments of the modules will also yield advantages in terms of heat removal when that is done not through natural convection but through forced ventilation, for example in a manner such that ventilating is provided by means of ventilators located beneath the modules 20.

The invention claimed is:

1. An automation device, comprising:
   a plurality of adjacent modules, each module comprising:
   a housing capsule that has at least one rear wall and two side walls and which is provided for housing electric components, wherein one of the side walls is embodied as being thermally conductive and the other side wall as being thermally insulated,
   wherein in each case a thermally conductive side wall of one module is adjacent to a thermally insulated side wall of another module, and
   wherein a chimney is formed between the thermally conductive side wall of the one module and the thermally insulated side wall of the other module such that air removes heat via the chimney.

2. The automation device according to claim 1, wherein the thermally conductive side wall is embodied as being substantially u-shaped.

3. The automation device according to claim 1, wherein the thermally conductive side wall is embodied as being substantially in the form of ribs.

4. The automation device according to claim 1, wherein the thermally conductive side wall is embodied as being substantially u-shaped and in the form of ribs.

5. The automation device according to claim 1, wherein the electric components are thermally coupled to the thermally conductive side wall.

* * * * *